United States Patent [19]

Lin

[11] Patent Number: 4,509,012

[45] Date of Patent: Apr. 2, 1985

[54] METHOD FOR DETERMINING THE CHARACTERISTIC BEHAVIOR OF A METAL-INSULATOR-SEMICONDUCTOR DEVICE IN A DEEP DEPLETION MODE

[76] Inventor: Shi-Tron Lin, 10746 Francis Pl., Apt. 139, Los Angeles, Calif. 90034

[21] Appl. No.: 454,690

[22] Filed: Dec. 30, 1982

[51] Int. Cl.³ .................... G01R 31/26; G01R 27/26
[52] U.S. Cl. .................. 324/158 D; 324/60 C; 324/158 T
[58] Field of Search ............ 324/158 T, 71.5, 71.6, 324/158 D, 60 C; 29/574; 364/488, 551, 550, 552

[56] References Cited

U.S. PATENT DOCUMENTS

| 3,731,192 | 5/1973 | Miller ............................ 324/158 T |
| 3,840,809 | 10/1974 | Yun ................................ 324/158 D |
| 3,882,391 | 5/1975 | Liles et al. ..................... 324/158 D |
| 3,995,216 | 11/1976 | Yun ................................ 324/158 D |
| 4,325,025 | 4/1982 | Corcoran et al. ............... 324/158 D |

OTHER PUBLICATIONS

"Determination of Minority Carrier Lifetime Using MIS Tunnel Diodes", S. Kar, Applied Physics Letters, vol. 25, No. 10, Nov. 1974, pp. 587-589.

Emery and DuBow, "Automated Electronic Analysis of Solar Cells", 14th IEEE Photovoltaic Specialists Conference, Jan. 1980, pp. 506-510.

Primary Examiner—Stewart J. Levy
Assistant Examiner—Kevin D. O'Shea
Attorney, Agent, or Firm—Pretty Schroeder Brueggemann & Clark

[57] ABSTRACT

First and second voltage sweeps are applied to a metal-insulator-semiconductor device with the device in a deep depletion mode during at least a portion of each sweep. Capacitance-voltage characteristics of the device are determined for at least a portion of each sweep while the device is in the deep depletion mode. Minority carrier generation parameters of the device in the deep depletion mode are determined based on the capacitance-voltage characteristics for the first and second voltage sweeps.

28 Claims, 17 Drawing Figures

METHOD FOR DETERMINING THE CHARACTERISTIC BEHAVIOR OF A METAL-INSULATOR-SEMICONDUCTOR DEVICE IN A DEEP DEPLETION MODE

FIELD OF THE INVENTION

The present invention relates generally to semiconductors, and more particularly, to the determination of minority carrier generation rates of metal-insulator-semiconductor devices.

BACKGROUND OF THE INVENTION

MIS devices frequently are used in the deep depletion mode, and it is important to characterize device behavior in this mode. It is well-known that the minority carrier generation rate and the minority carrier lifetime in the deep depletion region are important parameters in determining such device behavior. For example, the rate of minority carrier generation in the deep depletion region can influence transfer efficiency in charge coupled devices and refresh time in dynamic random access memories.

In the past, methods which determined the minority carrier generation rate and the associated generation lifetime took advantage of the fact that increasing the voltage applied to the gate electrode typically causes the capacitance of the device to decrease and causes the width of the depletion region to increase, and that under thermal equilibrium conditions at the threshold voltage, the capacitance reaches a minimum equilibrium capacitance, and the width of the depletion region reaches a maximum equilibrium width which remains relatively constant despite further increases in the applied voltage. Under non-equilibrium conditions and with an applied voltage greater than the threshold voltage, the capacitance of the device may fall below the minimum equilibrium capacitance, and the depletion region may expand beyond its maximum equilibrium width to form a deep depletion region.

For example, one method comprises the steps of measuring the capacitance across an MIS device as a voltage sweep of increasing magnitude drives it into a deep depletion mode and a voltage sweep of decreasing magnitude drives it back out of the deep depletion mode; the slope of a voltage versus capacitance curve for the forward sweep together with the difference in the voltages at the minimum equilibrium capacitance for the forward and reverse sweeps are determined and used to calculate the minority carrier generation lifetime in the deep depletion region.

In another method, a voltage pulse is applied to an MIS device to rapidly drive the device into the deep depletion mode in which its capacitance is below the minimum equilibrium capacitance. A fixed gage voltage is then applied to the device, and the time, known as the relaxation time, necessary for the generation of minority carriers to cause the capacitance to increase to the minimum equilibrium capacitance is then measured to determine the rate of minority carrier generation and the associated generation lifetime in the deep depletion region.

While these earlier methods of measuring the minority carrier generation rate generally have been satisfactory, there have been shortcomings with their use. For example, many of the earlier methods proved to be relatively inaccurate because they incorrectly assumed a uniform doping concentration in the deep depletion region. Additionally, methods involving the measurement of the relaxation time required a relatively long measurement time and complicated data treatment.

Accordingly, there has existed a need for an improved method for accurately measuring the minority carrier generation rate in the deep depletion region of an MIS device. The present invention meets this need.

SUMMARY OF THE INVENTION

The present invention resides in an improved method for determining the characteristic behavior of a metal-insulator-semiconductor device when the device is in a deep depletion mode.

More particularly, a presently preferred method comprises the step of applying a first initial gate voltage to the device to set first initial conditions. A first voltage sweep then is applied to the device with the device in the deep depletion mode during at least a portion of the sweep, and capacitance-voltage characteristics of the device are determined for a part of the sweep during which the device is in the deep depletion mode. A second initial gate voltage is applied to the device to set second initial conditions. A second voltage sweep then is applied to the device with the device in the deep depletion mode during at least a portion of the sweep, and capacitance-voltage characteristics of the device are determined for a part of the sweep during which the device is in the deep depletion mode. Minority carrier generation parameters of the device in the deep depletion mode are determined based on the capacitance-voltage characteristics of the device for the first and second voltage sweeps.

In one form of the invention, an initial gate voltage sets initial conditions by driving the device into an accumulation mode. In another form it drives the device into a depletion mode. In another, it drives the device into a deep depletion mode. Finally, in another form it sets initial conditions by driving the device into a thermal equilibrium inversion mode, or simply called inversion mode. When the device is in the accumulation, depletion or inversion mode under a set of initial conditions, a subsequent voltage sweep drives it into the deep depletion mode, and when the device is in the deep depletion mode under a set of the initial conditions, a subsequent voltage sweep drives it out of the deep depletion mode and into one of the three other modes.

In more detailed aspects of the invention, at least one derivative of a capacitance versus voltage curve for the first voltage sweep is determined, and at least one derivative for a capacitance versus voltage curve for the second voltage sweep is determined. Minority carrier generation parameters in the deep depletion region then are determined based on the derivatives.

In a preferred method, first derivatives of the capacitance versus voltage curves for the first and second voltage sweeps are determined at the same capacitance values and for each voltage sweep. The derivatives are used to determine a minority carrier generation rate in the deep depletion region of the device as a function of the width of the deep depletion region which then is used to calculate the minority carrier generation lifetime in the deep depletion region of the device.

In another aspect of the invention, at least one initial gate voltage can be a voltage pulse or a voltage sweep which drives the device into the deep depletion mode to set at least one set of initial conditions. Alternatively, at least one initial gate voltage can drive the device from a first gate voltage in the inversion mode to a second gate voltage in the inversion mode to set at least one set of initial conditions.

Initial conditions in which the device is in the inversion mode can be established by applying to the device a voltage step having a magnitude greater than the threshold voltage of the device. The capacitance of the device can be monitored to determine when it becomes constant indicating that the device has reached equilibrium inversion. Alternatively, there can be a time delay for a prescribed period of time between the application of the initial gate voltage and the subsequent voltage sweep to permit the device to reach equilbrium inversion. Optionally, a light pulse can be shined on the device to speed the transition to equilibrium inversion.

In an additional features of the invention, the first and second voltage sweeps can be linear, and their sweep rates can be of equal magnitude but in opposite directions. Furthermore, at least one voltage sweep rate can be slower than 100 volts per second in order to make clear the differences between the capacitance-voltage characteristics of the device for the first and second voltage sweeps.

Other aspects and advantages of the present invention should become apparent from the following description of the preferred embodiment, taken in conjunction with the accompanying drawings which disclose, by way of examples, the principles of the invention.

DESCRIPTION OF THE PREFERRED EMBODIMENTS

Figure 1A:
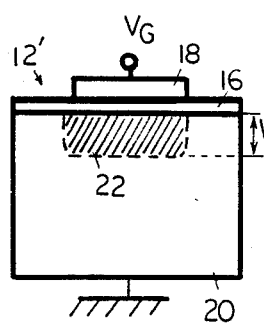
FIG. 1A is an MIS capacitor in the inversion mode.

As shown in FIG. 1A, a typical P-type MIS capacitor 12', which by itself forms no part of the present invention, has an insulator layer 16 such as silicon dioxide sandwiched between a gate electrode 18 and a P-type silicon crystal 20. It will be understood that while the discussion hereinafter generally focuses on a typical P-type MIS capacitor, the principles set forth generally apply to other types of MIS devices, such as devices comprising a polycrystalline-silicon gate electrode instead of a metal gate electrode, n-type silicon instead of P-type silicon, and to devices formed from semiconductor materials other then silicon.

Figure 1B:
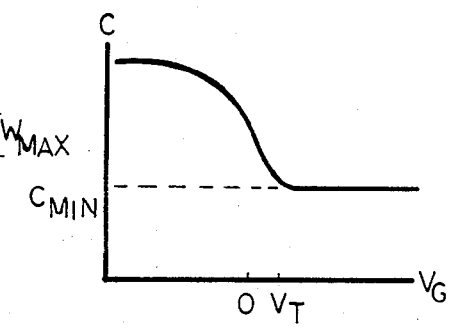
FIG. 1B is a curve representing the capacitance versus the gate voltage as the capacitor is driven into the inversion mode.

Application of a suitable positive gate voltage, $V_g$ to the gate electrode 18 causes positive majority carriers to be repelled from a region of the silicon crystal 20 adjacent to the electrode 18 leaving behind a depletion region 22. At thermal equilibrium the capacitance of the MIS capacitor 12', represented by the graph in FIG. 1B, decreases with increasing gate voltage, $V_g$, until the gate voltage reaches the threshold voltage, $V_T$, at which a minimum equilibrium capacitance, $C_{min}$, is reached. As illustrated by FIGS. 1A and 1B, when the capacitance of the device 12 is at its minimum equilibrium value the depletion region is at its maximum equilibrium width, $W_{max}$.

Figure 2A:
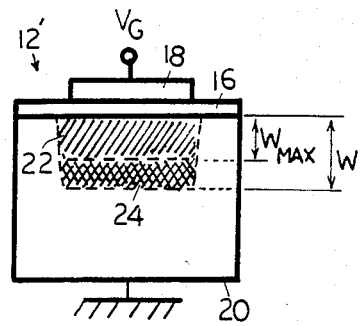
FIG. 2A is an MIS capacitor in the deep depletion mode.
Figure 2B:
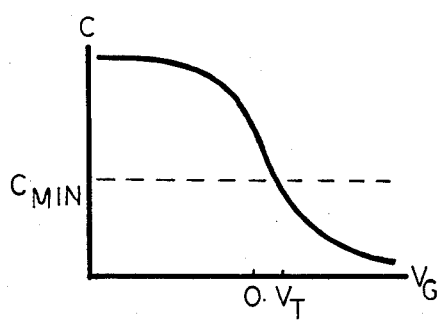
FIG. 2B is a curve representing the capacitance versus the gate voltage as the capacitor is driven into the deep depletion mode.

As shown in FIG. 2B, under thermal nonequilibrium conditions, as for example, when a relatively large voltage pulse is applied to the capacitor 12', the capacitance decreases below the minimum equilibrium capacitance, $C_{min}$. FIG. 2A illustrates that under such conditions, the capacitor 12' enters a deep depletion mode in which the depletion region 22 expands beyond its maximum depletion width, $W_{max}$ and forms a deep depletion region 24 having a width W.

Figure 3:
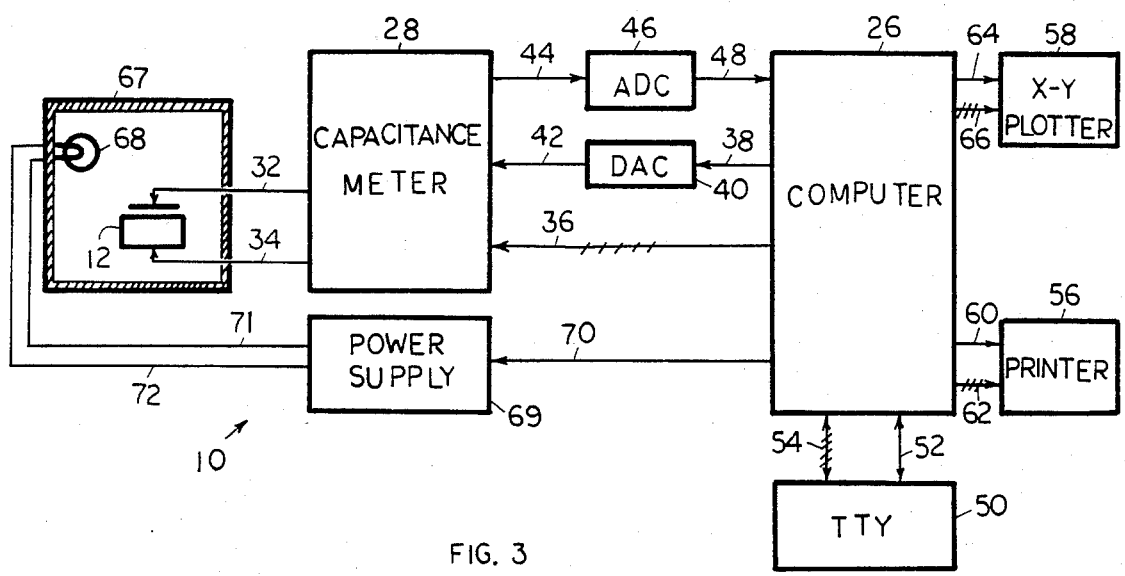
FIG. 3 is a block diagram of an apparatus for implementing the method of the invention.

As shown in FIG. 3, the presently preferred apparatus 10 for determining a minority carrier generation rate in the deep depletion region of an MIS device 12 includes a digital computer 26 which interfaces with a capacitance meter 28. The capacitance meter 28 is connected to the MIS device 12 under test over lines 32 and 34. The computer 26 adjusts the capacitance and voltage range of the capacitance meter 28 through control lines 36.

The computer 26 outputs an applied voltage signal to the capacitance meter 28 on line 38. The voltage is processed by a digital to analog converter 40 and inputted into a voltage input of the capacitance meter 28 on line 42. The voltage is then applied to the MIS device 12 through the capacitance meter 28.

The capacitance meter 28 outputs a resulting capacitance voltage signal corresponding to capacitance of the MIS device 12 on line 44. The capacitance voltage signal is processed by an analog to digital converter 46 which inputs a digital voltage signal into the computer on line 48.

A teletypewriter 50 is connected to the computer 26 to permit operator interaction with the apparatus 10.

Data can be transferred between the computer 26 and the teletypewriter 50 over line 52, and mutual control between the computer 26 and the teletypewriter 50 can be maintained over line 54.

Hard copies of data produced by the apparatus 10 can be provided by a printer 56 or an X-Y plotter 58 which can be connected to the computer 26. Data can be provided to the printer 56 through line 60, and computer control can be maintained over the printer 56 through line 62. Similarly, data can be provided to the X-Y plotter 58 over line 64, and computer control can be maintained over the X-Y plotter 58 over line 66.

A light tight enclosure 67 covers the test device 12 during the measurement. Natural or room light accelerates the minority carrier generation rate, and therefore should be avoided during the voltage sweeps.

Inside the light tight enclosure 67, a light source 68, such as an LED or regular light bulb, is turned on when an adequate voltage is supplied from power supply 69 through electrical connections 71 and 72. The power supply 69 and the voltage across lines 71 and 72 are controlled by signals from the computer 26 through control line 70.

Figure 4:
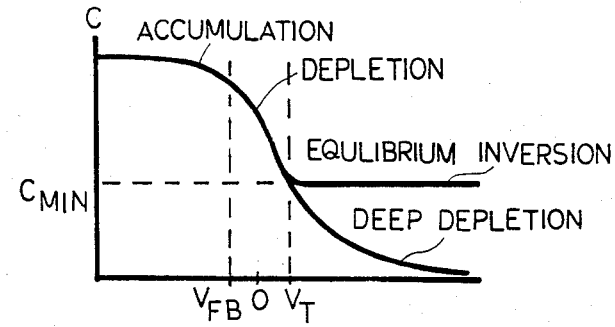
FIG. 4 is a curve showing the relationship between the capacitance of the device, the gate voltage and the mode of the device.

Upon initiation of the apparatus 10, it performs a first step of applying to the device 12 a first initial gate voltage which sets the first initial conditions. The first initial gate voltage, for example, can be a −10 volt step which drives the device 12 into the accumulation mode. The curve in FIG. 4 is representative of the relationship between the gate voltage, the capacitance of the device 12, and the mode of the device 12.

Figure 5A:
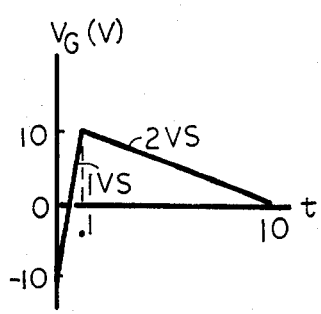
FIG. 5A is a timing diagram showing the gate voltage applied to the device.

After the first initial conditions have been set, a first voltage sweep is applied which drives the device 12 into the deep depletion mode. As shown in FIG. 5A in the segment of the curve labeled 1VS, the first voltage sweep can be a ramp voltage which increases from −10 volts to +10 volts in 0.1 seconds. The apparatus 10 determines the capacitance-voltage characteristics of the device during the first voltage sweep. The portion of the curve labeled 1CV in FIG. 5B exemplifies a typical capacitance versus voltage curve produced by the first voltage sweep.

Figure 5B:
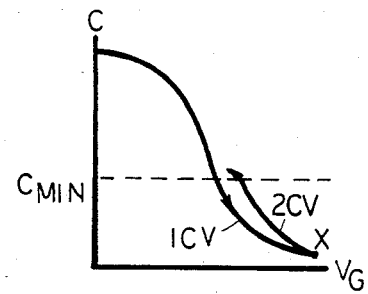
FIG. 5B is a diagram showing a representative capacitance versus voltage curve produced by the gate voltage of FIG. 5A.

Following the first voltage sweep, a second initial gate voltage is applied to the device 12 which sets the second initial conditions. As shown in FIG. 5B, the second initial conditions, for example, are the conditions which exist in the device 12 immediately after the first voltage sweep. In the case at hand, that means the second initial gate voltage is +10 volts with the device 12 in the deep depletion mode. The point on the curve labeled X in FIG. 5B represents the condition of the device 12 at the end of the first voltage sweep.

After the second initial conditions have been set, a second voltage sweep is applied to the device 12 which drives the device 12 out of the deep depletion mode. As shown in the segment of the curve labeled 2VS in FIG. 5A, the second voltage sweep is a ramp voltage which decreases from +10 volts to 0 volts in 10 seconds. While the second voltage sweep is being applied, the capacitance-voltage characteristics of the device 12 during the second sweep are determined. The segment of the curve in FIG. 5B labeled 2CV represents a typical capacitance versus voltage curve produced by the second voltage sweep.

The apparatus 10 determines the first derivatives of the capacitance-voltage curve, represented by the segment labeled 1CV in FIG. 5B, for the first voltage sweep at a series of ten selected capacitance values. It also determines the first derivatives of the capacitance-voltage curve, represented by the segment labeled 2CV in FIG. 5B, for the second voltage sweep at the same ten capacitance values.

The minority carrier generation rate in the deep depletion region of the device 12 is determined at a series of ten deep depletion widths based on the first derivatives for the first and second voltage sweeps using the following equations:

$$G(W) = \frac{c_I}{qA} \cdot \frac{S_1 S_2 (U_2 - U_1)}{S_2 U_2 - S_1 U_1} \quad (1)$$

$$W = k_s A (C^{-1} - C_I^{-1}) \quad (2)$$

where $G(W)$=minority carrier generation rate in the deep depletion region of the device 12 as a function of the width (W) of the deep depletion region; W=width of the depletion region; $C_I$=capacitance of the insulator; A=area of the gate electrode; $k_s$=dielectric constant of the semiconductor. q=electric charge of a minority carrier; $S_1$=sweep rate for the first voltage sweep; $S_2$=sweep rate for the second voltage sweep; (a positive value of S indicates a voltage which increases in magnitude, and a negative value of S indicates a voltage which decreases in magnitude); $U_1$=first derivative of the capacitance versus voltage curve for the first voltage sweep at a capacitance value C; $U_2$=first derivative of the capacitance versus voltage curve for the second voltage sweep at a capacitance value C; C=selected capacitance value at which both $U_1$ and $U_2$ are measured.

In determining the minority carrier generation rate, the apparatus 10 calculates values for $G(W)$ and W for the pair of first derivatives, $U_1$ and $U_1$, determined at each of the ten selected capacitances, C. Since a decrease in capacitance corresponds to an increase in the width of the deep depletion region, different capacitances correspond to a different deep depletion region widths. Thus, the apparatus calculates a series of ten minority carrier generation rates, each corresponding to a different deep depletion region width, W.

Figure 6:
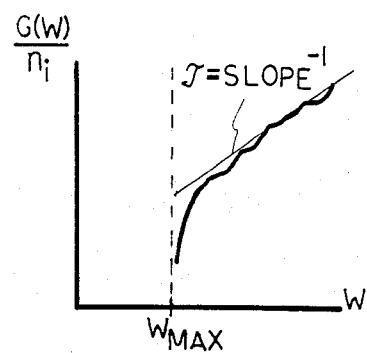
FIG. 6 is a curve representing the relationship between the minority carrier generation rate, the width of the deep depletion region and the minority carrier generation lifetime.

Finally, the minority carrier generation lifetime is determined based on $G(W)/n_i$ and W, where $n_i$ is the intrinsic carrier concentration in the semiconductor. As shown in FIG. 6 the minority carrier generation lifetime, $\tau$, equals the inverse of the slope of a curve representing $G(W)/n_i$ versus W.

While one form of the method comprising the present invention has been illustrated and described in detail, it will be appreciated that modifications and changes can be made thereto without departing from the principles of the invention. For example, instead of using initial conditions with the device 12 in the accumulation mode, the method can use initial conditions with the device 12 in the depletion, deep depletion or equilibrium inversion modes.

In a first alternate method, the apparatus 10 applies a first initial gate voltage which drives the device 12 into the depletion mode to set the first initial conditions. As shown in FIG. 4, a typical device 12 enters the depletion mode when the gate voltage is between the flat band voltage, $V_{FB}$, which is usually about −0.8 volts for a typical device 12 and the threshold voltage, $V_T$, (at which the device 12 would be driven into the inversion mode). The threshold voltage varies with the device being tested but typically is about 0.90 volts, and the first initial gate voltage typically is a step voltage of 0 volts.

After the first initial conditions have been set, the apparatus 10 applies a first voltage sweep which drives the device 12 into the deep depletion mode. For example, a typical first voltage sweep is ramp voltage represented by the segment labeled 1VS in FIG. 7A which increases from 0 volts to 10 volts in 5 seconds. The capacitance-voltage characteristics are determined during the first voltage sweep, and the segment in FIG. 7B labeled 1CV is representatives of typical capacitance-voltage characteristics during the sweep.

Figure 7A:
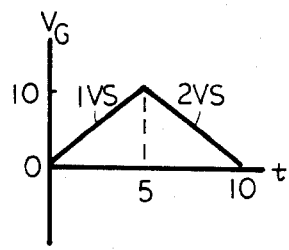
FIG. 7A is a timing diagram showing a first alternate gate voltage applied to the device.
Figure 7B:
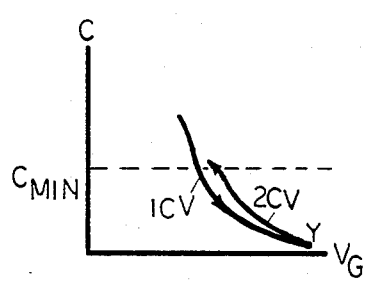
FIG. 7B is a diagram showing a representative capacitance versus voltage curve produced by the gate voltage of FIG. 7A.

After the first voltage sweep, the apparatus 10 applies a second initial gate voltage to the device 12 which sets the second initial conditions. In this alternate method, the second initial conditions are the conditions which exist in the device 12 at the end of the first voltage sweep. That is, the second initial gate voltage is +10 volts, and the device 12 is in the deep depletion mode. The point on the curve labeled Y in FIG. 7B represents the condition of the device 12 at the end of the first voltage sweep.

Once the second initial conditions have been established, a second voltage sweep is applied which drives the device 12 out of the deep depletion mode. Segment 2VS of the curve in FIG. 7A represents the second voltage sweep which is a ramp voltage which decreases from 10 volts to 0 volts in 5 seconds. During the second voltage sweep, the capacitance-voltage characteristics of the device 12 are determined. Segment 2CV in FIG. 7B represents a typical capacitance-voltage characteristic for the second voltage sweep. Subsequent steps for the determination of derivatives, minority carrier generation rates and the minority carrier generation lifetime are the same as those of the preferred method described hereinabove.

In a second alternate method, the apparatus 10 applies a first initial gate voltage which drives the device 12 into the deep depletion mode. A typical second initial gate voltage is either a voltage pulse of +20 volts or a rapid voltage sweep which increases from, for example, −10 volts to +20 volts in 2 seconds. The segment of the curve in FIG. 8A labeled 1PS represents a first voltage pulse of +10 volts which drives the device 12 to the point in the deep depletion region labeled Z in the curve of FIG. 8B to establish the first initial conditions.

Figure 8A:
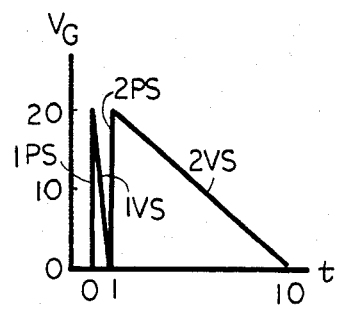
FIG. 8A is a timing diagram showing a second alternate gate voltage applied to the device.

Next, the apparatus 10 applies a first voltage sweep, represented by segment 1VS in FIG. 8A, in which the voltage decreases from +20 volts to 0 volts in 1 second. Meanwhile, the capacitance-voltage characteristics during the first voltage sweep are determined. Typical characteristics are illustrated by the segment labeled 1CV in FIG. 8B.

Figure 8B:
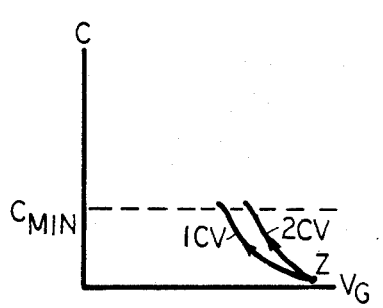
FIG. 8B is a diagram showing a representative capacitance versus voltage curve produced by the gate voltage of FIG. 8A.

A second +20 volt pulse represented by the portion of the curve in FIG. 8A labeled 2PS is applied to the device. The second voltage pulse drives the device back to the point in the deep depletion region labeled Z in FIG. 8B to set the second initial conditions. When the second initial conditions are set, a second voltage sweep labeled 2VS in FIG. 8A in which the voltage decreases from +20 volts to 0 volts in 10 seconds and drives the device 12 out of the deep depletion mode. The capacitance-voltage characteristics of the device 12 during the second voltage sweep are determined. The segment labeled 2CV in FIG. 8B is representative of the capacitance-voltage characteristics of the device 12 during the second sweep. Subsequent steps culminating in the determination of the minority carrier generation lifetime are the same as those of the preferred method described hereinabove.

In a third alternate method, the apparatus 10 applies a first initial gate voltage which drives the device 12 into the inversion mode. A typical first initial gate voltage is a step voltage of approximately 10 volts which exceds the threshold voltage. Ordinarily, a first gate voltage of 5 volts will suffice. Once the first gate voltage is applied, the capacitance of the device 12 is monitored to determine when it reaches a constant value indicating that the device 12 is in inversion. As an alternative to monitoring the capacitance, the apparatus 10 can wait for a prescribed period of time, usually on the order of minutes, for the device 10 to reach inversion. A light pulse produced by the light source 68 optionally can be used to speed the transition of the device 12 into the inversion mode.

Figure 9A:
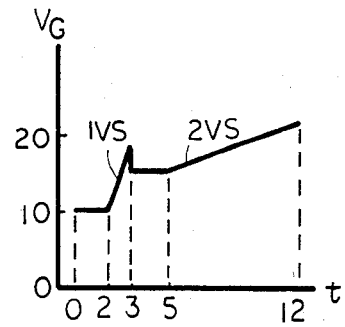
FIG. 9A is a timing diagram showing a third alternative gate voltage applied to the device.
Figure 9B:
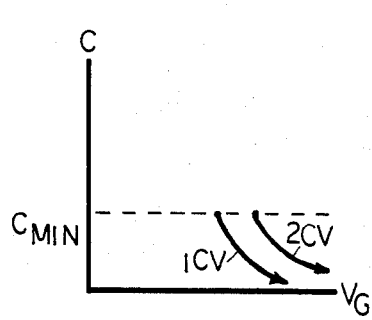
FIG. 9B is a diagram showing a representative capacitance versus voltage curve produced by the gate voltage of FIG. 9A.

Once the device 12 has reached inversion, a first voltage sweep is applied which drives the device 12 into the deep depletion mode. The first voltage sweep, illustrated as segment 1VS in FIG. 9A, is a ramp voltage which increases from 10 volts to 18 volts in 1 second. The capacitance-voltage characteristics of the device 12 during the first voltage sweep is determined, and segment 1CV of the curve in FIG. 9B represents a typical capacitance-voltage characteristics produced by the first sweep.

The apparatus 10 then applies to the device 12 a second voltage step having a magnitude of 15 volts. The capacitance of the device 12 is monitored to determine when the device 12 once again reaches equilibrium inversion. As before, a light pulse optionally can be applied to speed the achievement of the equilibrium inversion.

Figure 10A:
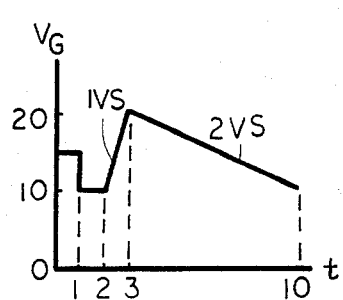
FIG. 10A is a timing diagram showing a fourth alternate gate voltage applied to the device.

When the device 12 has reached equilibrium inversion, a second voltage sweep is applied which drives the device 12 into the deep depletion region. The second voltage sweep represented as 2VS in the curve of FIG. 10A is a ramp voltage which increases from 15 volts to 23 volts in 7 seconds. The capacitance-voltage characteristics of the device 12 during the second voltage sweep are determined, and the portion of the curve labeled 2CV in FIG. 9B illustrates a typical capacitance-voltage characteristic produced during the second sweep. Subsequent steps leading to the determination of the minority carrier generation lifetime are the same as those of the preferred method first described hereinabove.

Figure 10B:
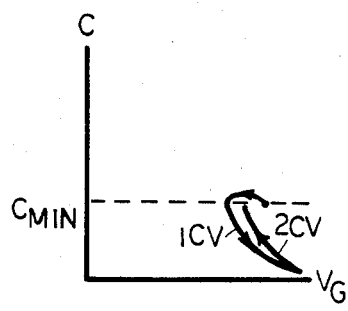
FIG. 10B is a diagram showing a representative capacitance versus voltage curve produced by the gate voltage of FIG. 10A.

In a fourth alternate method, the apparatus 10 applies a first initial gate voltage which drives the device 12 from a first gate voltage in the inversion mode, to a second gate voltage in the inversion mode. For example, as shown in FIG. 10A, the device 12 initially is in equilibrium inversion at +15 volts. The gate voltage is pulsed down to +10 volts, and the device 12 is allowed to return to the inversion mode. In order to insure that the device 12 has returned to equilibrium inversion before proceeding with further steps, the apparatus 10 can either wait for a prescribed period of time, usually about 1 or 2 seconds, or monitor the capacitance of the device until it becomes constant indicating that the device has reached equilibrium inversion. Once the device has reached the inversion mode, a first voltage sweep is applied which drives the device 12 into the deep depletion mode. As represented by the segment of the curve labeled 1VS, the first voltage sweep can be a ramp voltage which increases from 10V to 20V in 1 second. Following the first voltage sweep, a second voltage sweep is applied which drives the device 12 out of the deep depletion mode. As shown in the segment of the curve labeled 2VS in FIG. 10A, the second voltage sweep is a ramp voltage which decreases from 20V to 10V in 7 seconds. The segments of the curves in FIG. 10B labeled 1CV and 2CV represents the typical capacitance versus voltage curve produced by the first and the second voltage sweeps. The steps used to determine the minority carrier generation lifetime are the same as those disclosed in the first method discussed herein above.

From the foregoing, it will be appreciated that the present invention provides a new method for determining the minority carrier generation rate and the minority carrier lifetime in the deep depletion region of an MIS device 12. The method comprises the application of first and second voltage sweeps to the device 12 in the deep depletion mode; measuring the slopes of the resultant capacitance-voltage curves and using the slopes to calculate the minority carrier generation rate; and the minority carrier generation lifetime.

While particular forms of the invention have been illustrated and described, it will be apparent that various modifications can be made without departing from the spirit and scope of the invention. For example, the first and second initial conditions and the voltage sweeps can be selected to fit the particular device 12 being tested. Furthermore, mathematical relationships using other types of derivatives such as the derivative of a curve representing the inverse of the square of the capacitance versus the gate voltage can be used to determine the characteristic behavior of the device 12 during the first and second voltage sweeps. Also, derivatives can be measured at greater or fewer points on the capacitance-voltage curves. Additionally, other hardware circuits might alternatively be used to implement the invention. Accordingly, it is not intended that the invention be limited by the above description, except as set forth in the appended claims.

I claim:

1. A method for determining the characteristic behavior of a metal-insulator-semiconductor device in a deep depletion mode, comprising the steps of:
   applying a first initial gate voltage to set first initial conditions;
   applying a first voltage sweep with the device in the deep depletion mode during at least a portion of the sweep;
   determining capacitance-voltage characteristics of the device for a part of the first voltage sweep while the device is in the deep depletion mode;
   applying a second initial gate voltage to set second initial conditions;
   applying a second voltage sweep with the device in the deep depletion mode during at least a portion of the sweep;
   determining capacitance-voltage characteristics of the device for a part of the second voltage sweep while the device is in the deep depletion mode;
   determining minority carrier generation parameters of the device in the deep depletion mode based on the capacitance-voltage characteristics determined for the first and second voltage sweeps.

2. A method as defined in claim 1, wherein at least one of said initial gate voltages drives the device into an accumulation mode to set at least one set of initial conditions.

3. A method as defined in claim 2, wherein at least one of said voltage sweeps drives the device from the accumulation mode into a deep depletion mode.

4. A method as defined in claim 1, wherein at least one of said initial gate voltages drives the device into a depletion mode to set at least one set of initial conditions.

5. A method as defined in claim 4, wherein at least one of said voltage sweeps drives the device from the depletion mode into a deep depletion mode.

6. A method as defined in claim 1, wherein at least one of said initial gate voltages drives the device into a deep depletion mode to set at least one set of initial conditions.

7. A method as defined in claim 6, wherein at least one of said voltage sweeps drives the device out of the deep depletion mode.

8. A method as defined in claim 6, wherein at least one of said initial gate voltages is in the form a voltage pulse and drives the device into the deep depletion mode to set at least one set of initial conditions.

9. A method as defined in claim 6, wherein at least one of said initial gate voltages comprises a voltage sweep that drives the device into the deep depletion mode to set at least one set of initial conditions.

10. A method as defined in claim 1, wherein at least one of said initial gate voltages drives the device into an inversion mode to set at least one set of initial conditions.

11. A method as defined in claim 10, wherein at least one of said voltage sweeps drives the device from the inversion mode into a deep depletion mode.

12. A method as defined in claim 10, wherein at least one of said initial gate voltages comprises a voltage step which drives the device into the deep depletion mode, said method further comprising the step of monitoring a capacitance of the device at least until the capacitance reaches a constant value and the device is in the inversion mode.

13. A method as defined in claim 12 and further comprising the step of shining a light pulse on the device.

14. A method as defined in claim 10, wherein at least one of said initial gate voltages comprises a voltage step having a magnitude greater than a threshold voltage of the device, said method further comprising the step of monitoring a capacitance of the device at least until the capacitance reaches a constant value and the device is in the inversion mode.

15. A method as defined in claim 10, wherein at least one of said initial gate voltages drives the device into the deep depletion mode, said method further comprising the step of waiting for a prescribed period of time for the device to enter the inversion mode.

16. A method as defined in claim 15 and further comprising the step of shining a light pulse on the device.

17. A method as defined in claim 1, wherein at least one of said initial gate voltages drives the device from a first gate voltage in an inversion mode to a second gate voltage in the inversion mode.

18. A method as defined in claim 17 wherein said method further includes the step of monitoring a capacitance of the device at least until the capacitance reaches a constant value with the device in an inversion mode at said second gate voltage.

19. A method as defined in claim 17, wherein said method further includes the step of waiting for a prescribed period of time for the device to enter the inversion mode at said second gate voltage.

20. A method as defined in claim 1, wherein at least one voltage sweep comprises continuously incrementing voltage steps.

21. A method as prescribed in claim 1, wherein at least one voltage sweep has a sweep rate less than or equal to 100 volts per second.

22. A method for determining the characteristic behavior of a metal-insulator-semiconductor device in a deep depletion mode, comprising the steps of:

applying a first initial gate voltage to set first initial conditions;

applying a first voltage sweep with the device in the deep depletion mode during at least a portion of the sweep;

determining capacitance-voltage characteristics of the device for the first voltage sweep for a part of the sweep while the device is in the deep depletion mode;

applying a second initial gate voltage to set second initial conditions;

applying a second voltage sweep with the device in the deep depletion mode during at least a portion of the sweep;

determining capacitance-voltage characteristics of the device for the second voltage sweep for a part of the sweep that the device is in the deep depletion mode;

determining at least one derivative of a capacitance versus voltage curve for a portion of the first voltage sweep during which the device is in the deep depletion mode and at least one derivative of a capacitance versus voltage curve for a portion of the second voltage sweep during which the device is in the deep depletion mode;

determining minority carrier generation parameters of the device in the deep depletion mode based on the derivatives determined from the first and second voltage sweeps.

23. A method as defined in claim 22, wherein the step of calculating the minority carrier generation parameters includes the step of calculating a minority carrier generation rate as a function of the width of the deep depletion region.

24. A method as defined in claim 22, wherein the derivatives are calculated at at least two capacitance values.

25. A method as in claim 22, wherein said first and second voltage sweeps are linear.

26. A method as defined in claim 22, wherein the minority carrier generation rate in the depletion region is determined based on the following equations:

$$G(w) = \frac{C_I}{qA} \cdot \frac{S_1 S_2 (U_1 - U_2)}{S_1 U_1 - S_2 U_2}$$

$$W = K_s A (C^{-1} - C_I^{-1})$$

where $G(w)$ = minority carrier generation rate in the deep depletion region of the device as a function of the width (w) of the deep depletion region; $C_I$ = capacitance of an insulator layer of the device; $q$ = electric charge of a minority carrier; $S_1$ = sweep rate of the first voltage sweep; $S_2$ = sweep rate of the second voltage sweep; $U_1$ = first derivative of a capacitance versus voltage curve for said first voltage sweep at a capacitance value C; $U_2$ = first derivative of a capacitance versus voltage curve for said second voltage sweep at a capacitance value C; $A$ = area of the gate electrode; $C$ = common capacitance value of the device at which both $U_1$ and $U_2$ are determined.

27. A method as defined in claim 26, wherein the sweep rates of the first and second voltage sweeps are equal in magnitude and opposite in direction.

28. A method as defined in claim 26 wherein the step of determining the minority carrier generation lifetime includes the step of determining an inverse slope of a curve representing $G(w)/n_i$ versus W, where $n_i$ = intrinsic carrier concentration of the device.

* * * * *